(12) United States Patent
Borghetti et al.

(10) Patent No.: US 7,323,730 B2
(45) Date of Patent: Jan. 29, 2008

(54) OPTICALLY-CONFIGURABLE NANOTUBE OR NANOWIRE SEMICONDUCTOR DEVICE

(75) Inventors: Julien Borghetti, Cachan (FR);
Jean-Philippe Bourgoin, Voisins le Bretonneux (FR); Pascale Mordant, Villebon sur Yvette (FR); Vincent Derycke, Montigny le Bretonneux (FR); Arianna Filoramo, Saint Remy les Chevreuse (FR); Marcelo Goffman, Palaiseau (FR)

(73) Assignee: Commissariat a l'Energie Atomique (FR)

( * ) Notice: Subject to any disclaimer, the term of this patent is extended or adjusted under 35 U.S.C. 154(b) by 114 days.

(21) Appl. No.: 11/185,153

(22) Filed: Jul. 20, 2005

(65) Prior Publication Data

US 2007/0085155 A1 Apr. 19, 2007

Related U.S. Application Data

(60) Provisional application No. 60/589,896, filed on Jul. 21, 2004.

(51) Int. Cl.
*H01L 31/062* (2006.01)
(52) U.S. Cl. ............... 257/290; 257/431; 257/462; 257/E51.04; 257/E31.053; 977/936; 977/938; 977/932
(58) Field of Classification Search ............... 257/290
See application file for complete search history.

(56) References Cited

U.S. PATENT DOCUMENTS 6,410,205 B1 * 6/2002 Leichsenring et al. ... 430/273.1
6,835,394 B1 * 12/2004 Discher et al. ............ 424/450
2004/0241900 A1 * 12/2004 Tsukamoto et al. ........... 438/82
2006/0054922 A1 * 3/2006 Pettit ........................ 257/116

FOREIGN PATENT DOCUMENTS

FR 2 849 437 7/2004
WO WO 03/029354 A 4/2003

OTHER PUBLICATIONS

Balasubramanian et al., "Photoelectronic transport imaging of individual semiconducting carbon nanotubes", *Applied Physics Letters AIP USA*, vol. 84, No. 13, Mar. 29, 2004, pp. 2400-2402.
Kymakis et al., "Photovoltaic cells based on dye-sensitisation of single-wall carbon nanotubes in a polymer matrix", *Solar Energy Materials and Solar Cells, Elsevier Science Publishers*, vol. 80, No. 4, Dec. 2003, pp. 465-472.
Shim et al., "Photoinduced conductivity changes in carbon nanotube transistors", *Applied Physics Letters, American Institute of Physics*, vol. 83, No. 17, Oct. 2003, pp. 3564-3566.
Geens et al., "Field-Effect Mobility Measurements of Conjugated Polymer/Fullerene Photovoltaic Blends", *AIP Conference Proceedings, American Institute of Physics*, vol. CP544, No. 544, Mar. 2000, pp. 516-520.

* cited by examiner

Primary Examiner—Tu-Tu V. Ho
(74) Attorney, Agent, or Firm—Alston & Bird LLP

(57) ABSTRACT

The invention relates to a semiconductor device comprising at least two electrodes and at least one nanotube or nanowire, in particular a carbon nanotube or nanowire, the device including at least one semiconductive nanotube or nanowire having at least one region that is covered at least in part by at least one layer of molecules or nanocrystals of at least one photosensitive material, an electrical connection between said two electrodes being made by at least one nanotube, namely said semiconductive nanotube or nanowire and optionally by at least one other nanotube or nanowire.

23 Claims, 3 Drawing Sheets

OPTICALLY-CONFIGURABLE NANOTUBE OR NANOWIRE SEMICONDUCTOR DEVICE

CROSS-REFERENCE TO RELATED APPLICATIONS

This application claims the benefit of U.S. Provisional Application No. 60/589,896, filed Jul. 21, 2004, which is incorporated herein in its entirety.

FIELD OF THE INVENTION

The present invention relates to a nanotube or nanowire semiconductor device such as a transistor or a diode that is optically configurable, and to the use thereof in electronic circuits that are optically reconfigurable.

BACKGROUND OF THE INVENTION

The article by R. J. Chen et al. entitled "Molecular desorption from single-walled carbon nanotubes" published in Applied Physics Letters, Vol. 79, No. 14, 2258 (2001), states that powerful illumination in the ultraviolet or the visible can modify the electrical characteristics of a nanotube transistor by desorbing the oxygen molecules present on the electrodes. That phenomenon is fast, but in terms of reversibility, several tens of minutes are generally necessary to reestablish the initial current. That phenomenon which requires a large amount of power, is not wavelength specific and it is difficult to reverse.

The article by K. Balasubramanian et al. entitled "Photoelectronic transport imaging of individual semiconducting carbon nanotubes" published in Applied Physics Letters, Vol. 84, No. 13 (2004), states that photons having a wavelength situated at 514.5 nanometers (nm) and/or at 647.1 nm can generate a photo-current in a non-functionalized carbon nanotube transistor: the currents that are generated are very weak (<1 nanoamps (nA)) and can be detected only when the transistor is in the off state.

The article by Freitag et al. "Photoconductivity of single carbon nanotubes" published in Nano Letters, Vol. 3, No. 8, pp. 1067-1071 (2003), states that a nanotube transistor can be used to detect infrared photons. The current in a nanotube transistor can be modified by photons providing the wavelength of the light corresponds to the energy of one of the permitted transitions between Van Hove singularities (e.g. the forbidden band) of the semiconductive nanotube serving as a channel for the transistor. In general, this wavelength lies in the infrared for the first two accessible transitions. It is ultimately defined by the atomic structure of the nanotube (diameter and chirality).

The modifications that have been observed to the electrical characteristics of a transistor based on nanotubes by the presence of light are very small. Although they can be used to detect infrared radiation, the transistor is not genuinely "optically controlled". Only its off state current varies, and only in very small amounts. Finally, the process used (direct creation of electron-hole pairs through the forbidden band of the non-functionalized nanotube) possesses very low quantum efficiency (of the order of $10^{-7}$).

The article by A. Star et al. entitled "Nanotube optoelectronic memory devices", published in Nano Letters, June 2004, states that by functionalizing a device based on carbon nanotubes with a photosensitive polymer, it is possible to provide a memory function. For this purpose, a set of nanotubes is covered in a thick polymer film (drop deposited on the chip). That thus concerns polymers (very large molecules) being deposited in non-controlled manner in the form of very thick layers. When the device is illuminated, the Id(Vgs) electrical characteristic is shifted, thus indicating that electrons have been transferred to the polymer. When illumination is stopped, the device conserves its characteristics for a very long time (several minutes), thus providing a "memory" effect. That technique is limited to "memory" type characteristics and is not compatible with dense integration.

The article by Rotkin and Zmarov entitled "Nanotube light-controlled electronic switch" published in International Journal of Nanoscience, Vol. 1, Nos. 3 and 4 (2002), pp. 347-355 proposes displacing an electric charge in the proximity of a carbon nanotube by using a shape-changing molecule. When a photon is absorbed, the molecule deforms. According to that theoretical study, if the molecule carries a charge at its end further from the tube, then the charge can be moved mechanically towards or away from the tube, which can serve to modify the characteristics of the device. In any event, that technique requires shape-changing molecules to be used.

OBJECTS AND SUMMARY OF THE INVENTION

An object of the present invention is to provide a semiconductor device including at least one nanotube, in particular a carbon nanotube, or at least one nanowire, which device is optically configurable with favorable quantum efficiency and is reversible, without any significant memory effect, i.e. the device returns to its initial state when illumination ceases. Advantageously, the device is optically configurable with light at a wavelength selected as a function of the selected photosensitive material.

The invention also provides a semiconductor device comprising at least two electrodes and at least one nanotube or nanowire, in particular a carbon nanotube or nanowire, the device including at least one semiconductive nanotube or nanowire having at least one region that is covered at least in part by at least one layer of molecules or nanocrystals of at least one photosensitive material, an electrical connection between said two electrodes being made by at least one nanotube, namely said semiconductive nanotube or nanowire and optionally by at least one other nanotube or nanowire.

Advantageously the molecules are amphiphilic.

The material may in particular be a phthalocyanine presenting a metallic central atom, in particular of copper, a porphyrine, an azoporphyrine, or a derivative thereof, or indeed a dye or a chromophore, in particular an amphilipic chromophore, or indeed complex molecules composed of at least two portions, e.g. a chromophoric center and a graftable portion that can be grafted onto the device in optionally covalent manner. In a variant, it may be a nanocrystal of semiconductor material.

The material may be in the form of a thin film, e.g. having one to 20, and more particularly one to ten, layers of molecules of the material. Thinner films are preferred because they are suitable for obtaining opto-electronic effects that are fast.

A thin film may advantageously be replaced by an optionally covalent graft of a molecular monolayer on a selected portion of the device (the nanotube, the electrodes, and/or the surface supporting the tube).

The region in which the material is deposited or grafted may be an outside and/or inside surface of the nanotube or nanowire, or it may be an electrode of the semiconductor device, or indeed the surface of a gate dielectric of a transistor, or indeed the surface of a substrate on which the nanotube or nanowire is located.

The device may present one or more regions each covered in at least one said layer of different photosensitive materials.

The invention also provides a method of controlling a semiconductor device as defined above, the method implementing illumination of at least one said region by means of light at a wavelength situated in a light-absorption region of said material.

BRIEF DESCRIPTION OF THE DRAWINGS

Other characteristics and advantages of the invention will appear better on reading the following description given with reference to the drawings, in which.

MORE DETAILED DESCRIPTION

Figure 1A:
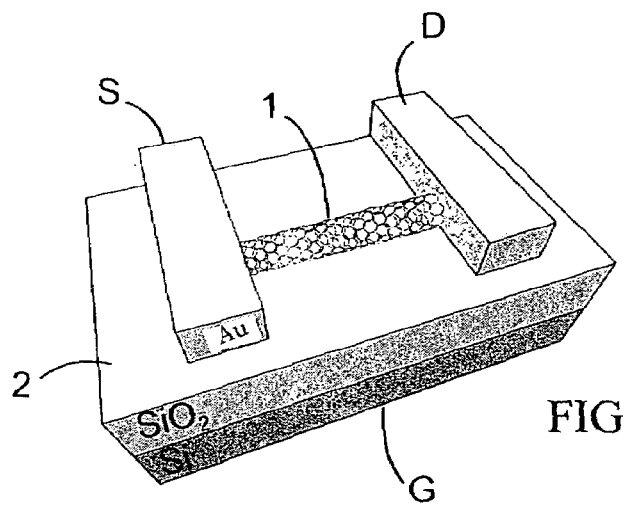
FIG. 1a shows an example of a carbon nanotube field-effect transistor known as "CNTFET", FIGS. 1b and 1c constitute variants of the device that can be used in the context of the present invention.

Depending on their structure (chirality), single-walled carbon nanotubes may be metallic or semiconductive. They can be connected to electrodes so as to form electronic components. Thus, in the period 1996 to 2004, such nanotubes have been used as basic elements for fabricating diodes, single-electron transistors (SETs), and carbon nanotube field-effect transistors (CNTFETs). Such CNTFETs can themselves be used for fabricating memory elements, individual logic gates, detectors of gas or biological molecules, or indeed emitters and detectors of infrared photons.

A field-effect transistor of the CNTFET type is constituted, for example, by a semiconductive single-walled carbon nanotube 1 connected by two electrodes (source S and drain D), and controlled by a third electrode (gate G) that is separated from the tube by insulation 2 (gate oxide). The current flowing between the source S and the drain D along the channel constituted by the nanotube 1 is modulated by the gate voltage. The above configuration is not the only configuration possible. In particular, the gate electrode may lie below or above the nanotube.

Since 1998, the performance of such components has continued to improve, in particular over the last two years, so as to reach a level comparable with silicon transistors.

One of the important features of such electronic components based on carbon nanotubes is great sensitivity to their environment. The presence of molecules adsorbed on the various portions of these components (tube, electrodes, surface) modifies their electron transport properties very significantly.

The environment of a CNTFET can modify its electrical characteristics in several ways:

a) molecules adsorbed or chemically bonded to the nanotube can transfer charge to the nanotube (donating or accepting electrons). This exchange leads to a change in the doping level of the nanotube;

b) molecules adsorbed or chemically bonded to the electrodes, in the proximity of the nanotube, can modify carrier injection into the channel. In order to enter into the nanotube, a charge present in the electrodes generally needs to overcome a potential barrier (as happens with a Schottky contact). The height of this barrier is sensitive to the presence of certain molecules, in particular polar molecules; and c) the adsorption of molecules on the tube, or on the surface in the proximity of the nanotube, can also modify the electrical characteristics of the component without there being any transfer of charge between the molecule and the nanotube. In particular, charged or highly polar molecules in the proximity of the tube modify the electrostatic potential at the tube and thus act like a voltage applied to the gate (referred to as "chemical gating" or chemically-induced gate potential).

The invention seeks in particular to use light for triggering, stopping, increasing, decreasing, and/or reversing effects of this type.

Numerous classes of molecules present photochemical or photophysical properties. Very generally speaking, when a molecule absorbs a photon, it switches to an excited state. Such excess of energy can have various consequences. The molecule can: split into several fragments; luminesce; suffer a non-radiative transition; be ionized; change shape; react with other molecules to form a new compound or to transfer charge; transfer its excitation to another molecule. Some of those mechanisms, and in particular the last four, can be used to control the transport properties of a nanotube transistor.

a) Photo-Induced Doping

Figure 2:
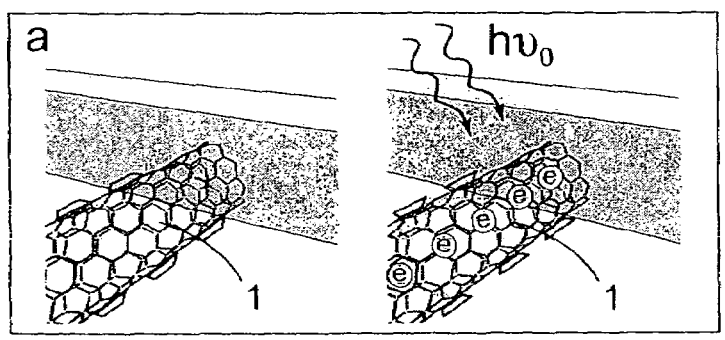
FIGS. 2a to 2c show different locations for the photosensitive layer and the effects that result therefrom.
Figure 2:
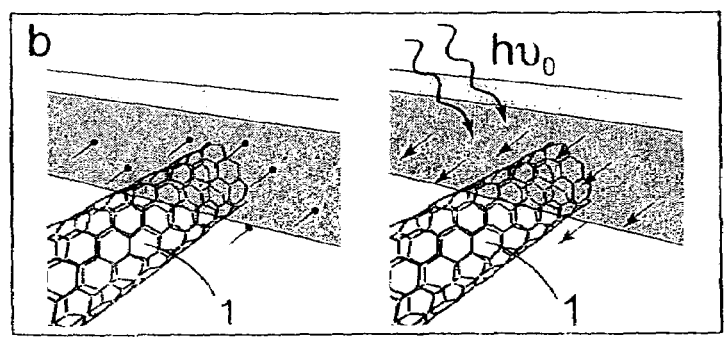
Figure 2:
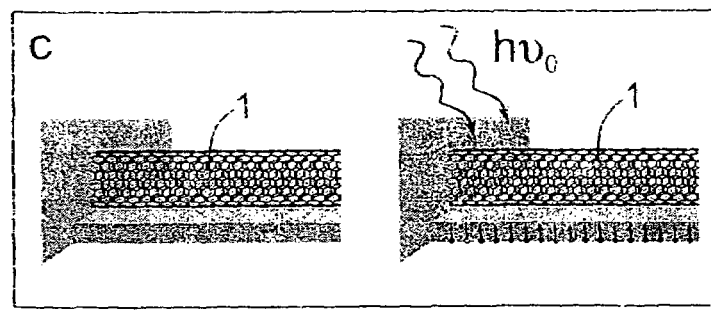

Certain molecules in solution can donate or accept electrons when absorbing a photon. In the example below, molecules are adsorbed on the tube which transfer charge thereto when they are in the excited state (FIG. 2a). This leads to a change in the doping level of the transistor channel.

It is also possible to use the remarkable optical properties of semiconductive nanocrystals (typically CdSe). When a photon is absorbed by a semiconductive nanocrystal, that leads to an electron-hole pair (exciton) being formed. Charge can then be observed to be transferred towards the molecules present at the surface of the nanocrystal. A transfer of holes is thus observed when the surface of the nanocrystal is functionalized with molecules of reducing character such as thiols or poly-aromatic compounds. Semiconductive nanocrystals grafted on the nanotube (possibly by prior functionalization of its surface) or deposited in the immediate vicinity thereof should thus make photo-induced doping possible. Another advantageous property of nanocrystals is the way their absorption spectrum depends on their size and on the type of chalcogenide used (CdTe, CdSe, CdS). It should thus be possible to select the wavelength of the radiation that induces the photo-doping effect by using nanocrystals of different diameters or compositions.

b) Photo-Induced Modification of Charge Injection

It is known that the chemical structure of certain molecules is modified by the absorption of a photon. This can result in particular in a change in the electrical dipolar moment if the distribution of the centers of positive and negative charges differs from one state to the other. If such molecules are grafted on the electrodes of a CNTFET (FIG. 2b), the injection of carriers into the nanotube will be sensitive to the state of the molecule, and thus to light.

c) Photo-Induced Gate Potential

It is also possible to use such molecules grafted on the nanotube or on the surface of the gate oxide (FIG. 2c). The adsorption of a photon then modifies the electrostatic environment of the nanotube, and thus produces an effect comparable to that of chemical gating.

EXAMPLE

A Carbon Nanotube Transistor with Electrical Characteristics that can be Modulated by Light In this example, the nanotube transistor is covered in a phthalocyanine Langmuir-Blodgett film known as CuS18. The chromophore molecules used are amphilipic phthalocyanines having a positively-charged chromophore heart with four C18 aliphatic chains (i.e. each having 18 atoms of carbon). CuS18 is a compound described in 1986 by Serge Palacin in the reference: S. Palacin, A. Ruaudel-Teixier, A. Barraud, J. Phys. Chem., 90, 6237-6242 (1986). The name CuS18 comes from a system for naming a series of compounds of similar structures. The full name is tetraoctadecyltetrapyridino[3,4-b:3',4'-g:3''',4''-1:3''',4'''-q]porphyrazinium.

The typical size of the molecules is 1.7 nm diameter for the chromophore core, with 2.0 nm chains bonded to its edges and mobile. The Langmuir-Blodgett film deposition technique makes it possible to control accurately the quantity of molecules deposited by superposing monolayers (monolayer by monolayer). The effect described below has been reproduced with a single layer, two layers, and ten layers of molecules on the transistor. In practice it is possible to superpose up to about twenty monolayers or even more, for example.

The invention is not in any way limited to using layers deposited by the Langmuir-Blodgett technique. Other methods exist for depositing layers that are known to the person skilled in the art, such as chemical vapor deposition (CVD), etc. It is also possible to functionalize the nanotubes prior to assembling them within devices.

Under laser illumination at a given wavelength (in this case 647.1 nm) corresponding to an absorption maximum in the spectrum of the molecule, thereby giving it wavelength selectivity that depends on the molecule used, molecules that are in contact with the tube transfer electrons to the tube and become positively charged. The presence of said positively charged molecules causes a reduction in the density of positive charge (holes) in the tube. Since holes are responsible for the current flowing in the transistor at negative gate voltages, a reduction in their number leads to a significant reduction in the current through the transistor while it is illuminated.

Figure 3:
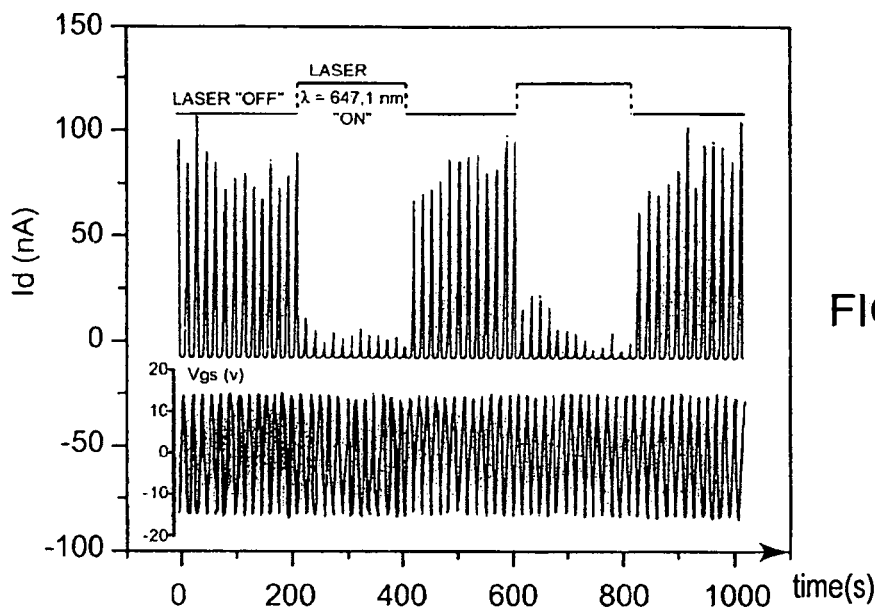
FIG. 3 shows a series of tests with and without excitation by laser light.

To show the dynamics of this phenomenon, FIG. 3 is a set of curves as a function of time and showing cycles of sweeping through the voltage Vgs. This amounts to a string of Id(Vgs) characteristics. A sudden drop in current is observed when the laser is on. What is particularly remarkable is the fast reversibility of the phenomenon.

Other work, in particular that cited above, has revealed photo-induced phenomena that are difficult to reverse: photo-desorption of molecules from the electrodes to the transistor and charge storage in a photo-sensitive polymer. The fact that the curves in FIG. 3 return to their initial nature as soon as the laser is switched off clearly reveals that some other mechanism is involved. The power of the laser was increased experimentally until the photo-desorption phenomenon was reached. There exists a broad range of powers enabling the advantageous phenomenon with fast dynamics to be observed on its own, before reaching the photo-desorption threshold.

Figure 4A:
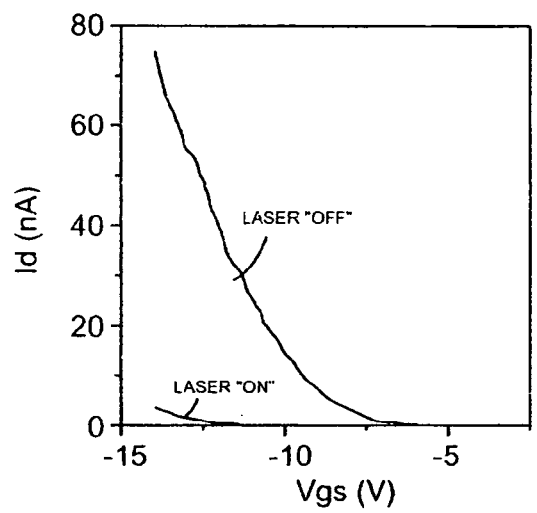
FIGS. 4a and 4b show the characteristic of drain current Id as a function of the gate source voltage Vgs of a transistor respectively in the dark and in the presence of illumination by a red laser ($\lambda$=647.1 nm), the same curve being shown using semilogarithmic coordinates in FIG. 4b.

FIG. 4a shows the Id(Vgs) characteristic of the transistor in the dark and when illuminated by a red laser ($\lambda$=647.1 nm), obtained by averaging the Id(Vgs) recordings correspond to the curves of FIG. 3. It can be seen very clearly that this characteristic is drastically modified by photons, in particular in the ON state (which is a major difference with the prior art).

Figure 4B:
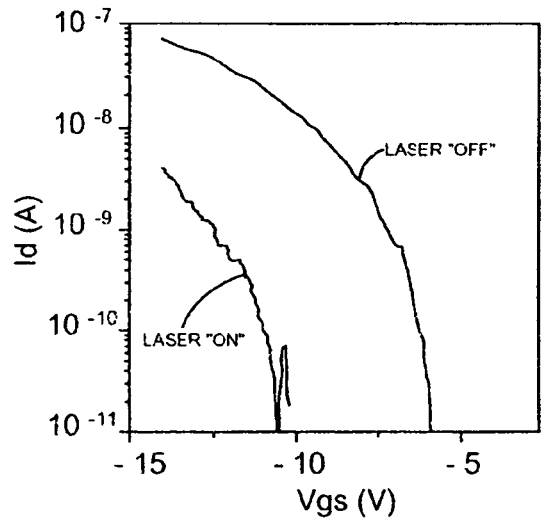

In order to see the OFF state as well, the same curves are presented in FIG. 4b using a semilogarithmic scale. It can clearly be seen that for grid voltages greater than the threshold voltage, the OFF state is also significantly modified.

Finally, it is important to observe that this phenomenon is robust. The laser can be cycled a very large number of times without degrading the layer of molecules.

The invention makes it possible to maximize interactions between nanotubes and relatively small molecules (compared with polymer molecules) by working on very small quantities down to a single layer of molecules, thereby giving access to electrical effects that are fast and potentially localized, thus making it possible to use transistors in circuits that are both reconfigurable and integrated.

Such a transistor can be used to fabricate an optically-reconfigurable circuit. It behaves like a switch controlled by light. If the voltage Vgs is set at a negative value (e.g. −10 V for the particular case shown in FIG. 4), then in the presence of light the transistor prevents current from flowing (as can clearly be seen from the logarithmic scale: Id<<$10^{-11}$ A). If the component is located at the input to a sub-circuit, the sub-circuit will be activated in the absence of light and deactivated in the presence of light.

In the context of the present invention, it is possible to implement a single semiconductive nanotube or nanowire (as in FIG. 1), or indeed a set of nanotubes and/or nanowires, of which at least one is semiconductive, connected between two electrodes (a source S and a drain D for a transistor—FIG. 1b), or indeed a set of nanotubes and/or nanowires, of which at least one is semiconductive, providing a path between the electrodes (a source and a drain for a transistor—FIG. 1c), with no tube considered on its own connecting the two electrodes.

Figure 1B:
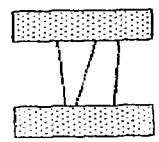
Figure 1C:
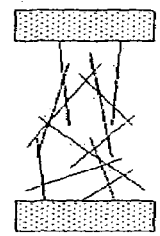

The variants in FIGS. 1b and 1c take advantage of the high mobility of charge in carbon nanotubes (up to 79000 square centimeters per volt per second ($cm^2$/V/s), as opposed to values of $10^{-3}$ $cm^2$/V/s to $10^{-1}$ $cm^2$/V/s in organic materials.

Other molecules can be used:

other phthalocyanines in which the central atom can be a metal other than copper, and/or in which the aliphatic chains can be replaced by some other chain;

porphyrines, azoporphyrines, and derivatives thereof; or any type of fluorophore or chromophore, including semiconductive nanocrystals, e.g. of CdTe, CdSE, or CdS. Nanocrystals can be used as such or they can be modified by being surrounded either in a shell of some other material (e.g. ZnSe), or in a covering of molecules. By way of example, ZnSe can serve to prevent an absorbed photon being re-emitted.

Several deposition techniques can be implemented for depositing the above molecule.

The first consists in depositing a controlled number of layers of molecules (one or more) on an existing transistor, as in the above example. In particular, it is possible to use the following ampliphilic molecules:

phthalocyanines with a central metallic atom in which the fatty chains, of length C18 or of different length, provide the amphilipic nature;

porphyrines, azoporphyrines, and amphilipic derivatives thereof; or any amphilipic chromophore or dye.

The second technique which implements an optionally covalent connection consists in depositing a controlled number of layers of molecules (typically only one) by chemisorption or physiosorption on an existing transistor.

The third technique consists in assembling nanotubes and molecules in solution, implementing optionally covalent connections, the nanotubes then being covered in a small number of molecules, typically a single layer. Such nanotubes can be used for fabricating transistors (or diodes) a posteriori.

Those three techniques are compatible with making dense circuits responding to a plurality of wavelengths. In the first two cases, the circuits are made before associating molecules with the nanotubes. By successively masking certain portions of a circuit, it is possible to deposit different molecules on different transistors (or circuit portions). Alternatively, it is possible to use dip pen type techniques to functionalize different transistors with different molecules. Such techniques (well documented in the literature, e.g. Piner et al., C.A. Science 1999, 283, 661, or Hong et al., C.A. Science 1999, 286, 523, or indeed Hong et al., C.A. Science 2000, 288, 1808) consist in using molecules as "ink", together with the tip of an atomic force microscope (AFM) as a "pen". The tip of an AFM is moved up to a supply of molecules, and then to the device that is to be modified. Under certain conditions, the molecules can migrate from the tip of the AFM to the nearby surface.

Alternatively, selective chemical functionalization of the transistors can be performed by electro-grafting. By putting the circuit into contact with a reagent (e.g. by immersing it), and by electrically biasing one (or more) transistors, it is possible to functionalize that or those transistors specifically without affecting others that are not biased. By changing the reagents and the transistors that are biased, it is possible to achieve a variety of selective functionalizations on a single circuit.

Concerning the deposition of electrodes, it should be observed that all chromophore molecules terminated by a thiol group (SH) can be grafted onto electrodes made of gold by forming a gold-sulfur bond. Concerning the gate, it is possible to use methods for functionalizing silicon oxide by molecules of the chloro-silane or ethoxy-silane type, and that is compatible with making carbon nanotube transistors. Reference can be made in particular to the following publications:

K. C. Choi, J. P. Bourgoin, S. Auvray, D. Esteve, G. S. Duesberg, S. Roth, Burghara, Surface Science 462, 195 (2000); and E. Valentin, S. Auvray, A. Filoramo, A. Ribayrol, M. Goffman, L. Cape, J. P. Bourgoin, J. N. Patillon, Mat. Rers. Soc. Symp. Proc. 772, M4.7.1 (2003).

FIGS. 5a to 5f show the various effects that can be obtained on a p-type transistor, with the utilization range being set between gate/source voltages Vgs lying in the range −1 V to +1 V, by way of example. Analogous effects can be obtained with an n-type transistor.

Figure 5:
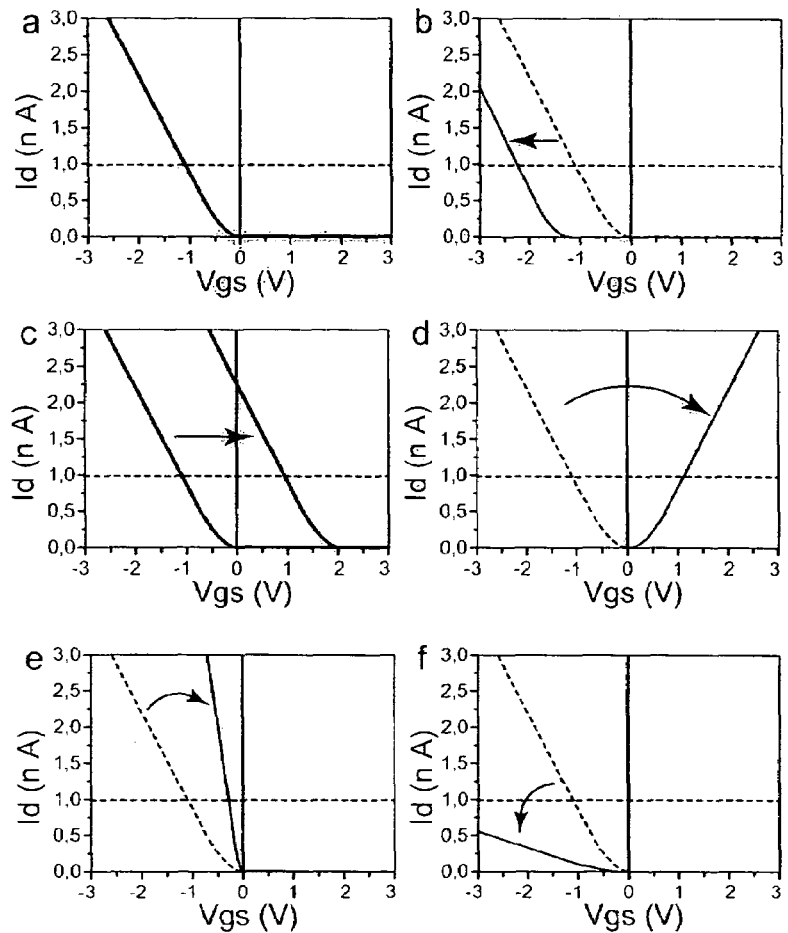
FIGS. 5a to 5f use an experimental curve for drain current Id (in nA) as a function of gate source voltage Vgs (in V), to show various effects that can be obtained for a p-type carbon nanotube transistor with an operating range for the voltage Vgs lying in the range −1 V to +1 V.

FIG. 5a: transistor at rest (not illuminated);

FIG. 5b: the effect of light causes the transistor to remain in the OFF state throughout the utilization range. This corresponds to using electron donor molecules as is the above example;

FIG. 5c: the effect of light is such that the transistor is always ON in the utilization range. This corresponds to electron acceptor molecules;

FIG. 5d: the effect of light is such that the p-type transistor is transformed into an n-type transistor. This corresponds to electron donor molecules for which the hole current is illuminated for Vgs<0 as in FIG. 5b, but for which electron current also appears at Vgs<0;

FIG. 5e: the effect of light is such that transconductance is improved. This corresponds to reducing the height of the Schottky barrier by increasing hole injection; and FIG. 5f: the effect of light is such that transconductance is decreased. This corresponds to increasing the height of the Schottky barrier by limiting hole injection.

To sum up, the effects shown in FIGS. 5b to 5d correspond to "doping", whereas the effects shown in FIGS. 5e and 5f correspond to modifying injection by modifying the electrodes.

The wavelength of the light controlling the transistors is selected as a function of light absorption by the molecules used. This wavelength can therefore be selected over a broad range (depending on the materials used) including the visible and the near ultraviolet. This possibility of adjusting the control wavelength by a parameter external to the nanotube is the key for using this control in making circuits. It makes it possible to envisage circuits containing a plurality of transistors functionalized by different molecules and reacting to different wavelengths.

The invention also provides a reconfigurable electronic circuit comprising at least one semiconductor device as defined above, coupled to at least one lighting device suitable for modifying at least one electronic parameter and/or the function of said semiconductor device.

Figure 6:
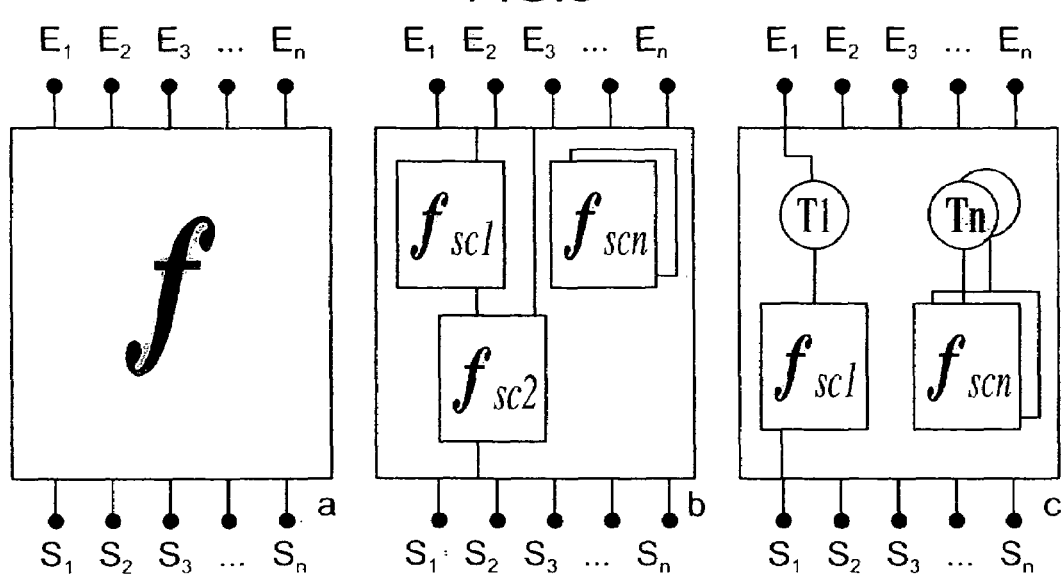
FIGS. 6a to 6c show various optically reconfigurable circuits implementing one or more devices of the invention.

Functionally speaking, an electronic circuit can be considered as a "black box" (FIG. 6) serving to transform a set of electrical input signals (E1 to En) into a set of output signals (S1 to Sn). The function performed by the circuit is the function f giving the output signals as a function of input signals. The overall circuit may contain sub-circuits that operate on a restricted range of input signals and that provide a restricted set of intermediate output signals.

The circuit is optically reconfigurable if the overall function f varies as a function of illumination (presence or absence of illumination, intensity I, wavelength λ). For this purpose, several configurations can be considered:

the circuit (FIG. 6a) is a simple circuit. There is no need to design it as a set of sub-circuits. f is a function of illumination: f(I,λ);

the circuit (FIG. 6b) is made up of sub-circuits each responding differently to light: $f_{scn}(I_n, \lambda_n)$. Optionally, certain sub-circuits need not be sensitive to light. With this option, each sub-circuit is functionalized with a different type of molecule; and the circuit (FIG. 6c) is made up of sub-circuits that do not respond to light, but their activation is controlled by control transistors ($T_1$ to $T_n$) that are themselves photosensitive. In this option, only the control transistors are chemically functionalized so as to make them photosensitive at one or more selected wavelengths.

What is claimed is:

1. A semiconductor device comprising at least two electrodes and at least one nanotube or nanowire, the device including at least one semiconductive nanotube or nanowire having at least one region that is covered at least in part by one to twenty layers of molecules or by nanocrystals of at least one photosensitive material, an electrical connection between said two electrodes being made by said semiconductive nanotube or nanowire and optionally by at least one other nanotube or nanowire.

2. A device according to claim 1, wherein said molecules are amphilipic.

3. A semiconductor device comprising at least two electrodes and at least one nanotube or nanowire, the device including at least one semiconductive nanotube or nanowire having at least one region that is covered at least in part by at least one layer of molecules or nanocrystals of at least one photosensitive material, wherein said material is a phthalocyanine presenting a metallic central atom, an electrical connection between said two electrodes being made by said semiconductive nanotube or nanowire and optionally by at least one other nanotube or nanowire.

4. A device according to claim 3, wherein said central atom is a copper atom.

5. A device according to claim 3, wherein the phthalocyanine presents amphilipic chains.

6. A device according to claim 1, wherein said material is a porphyrine, an azoporphyrine, or derivatives thereof.

7. A device according to claim 1, wherein said material is a dye or a chromophore.

8. A device according to claim 1, wherein said material is in the form of a thin film.

9. A device according to claim 1, wherein said material is in the form of a molecular monolayer that is grafted in a covalent manner.

10. A device according to claim 1, wherein at least one said layer is ordered.

11. A device according to claim 1, wherein said material is a semiconductive nanocrystal.

12. A device according to claim 1, wherein a said region is an outside and/or inside surface of the semiconductive nanotube or the semiconductive nanowire.

13. A device according to claim 1, wherein a said region is an electrode of the semiconductor device.

14. A device according to claim 1, comprising a semiconductive nanotube or a semiconductive nanowire provided with said electrodes.

15. A device according to claim 1, constituting a transistor.

16. A device according to claim 15, wherein a said region is a surface of a gate dielectric of the transistor.

17. A device according to claim 15, wherein a said region is a surface of a substrate on which at least said semiconductive nanotube or semiconductive nanowire is disposed.

18. A device according to claim 13, wherein the semiconductor device is a diode.

19. A semiconductor device comprising at least two electrodes and at least one nanotube or nanowire, the device including at least one semiconductive nanotube or nanowire having at least two regions covered at least in part by at least one layer of molecules or nanocrystals of at least one photosensitive material, each said region covered in at least one said layer of different photosensitive materials, an electrical connection between said two electrodes being made by said semiconductive nanotube or nanowire and optionally by at least one other nanotube or nanowire.

20. An electronic circuit comprising at least one semiconductor device according to claim 1 coupled with at least one illumination device suitable for modifying at least one electronic parameter and/or the function of said semiconductor device.

21. A method of controlling a semiconductor device comprising at least two electrodes and at least one nanotube or nanowire, the device including at least one semiconductive nanotube or nanowire having at least one region that is covered at least in part by at least one layer of molecules or nanocrystals of at least one photosensitive material, an electrical connection between said two electrodes being made by at least said semiconductive nanotube or nanowire and optionally by at least one other nanotube or nanowire, the method comprising implementing illumination of at least one said region by means of light at a wavelength situated in a light-absorption region of said material.

22. A device according to claim 1, wherein the number of layers is from one to ten.

23. A device according to claim 1, wherein said nanotube or nanowire is a carbon nanotube or nanowire.

* * * * *